United States Patent [19]

Grabbe et al.

[11] Patent Number: 5,073,118
[45] Date of Patent: Dec. 17, 1991

[54] SURFACE MOUNTING AN ELECTRONIC COMPONENT

[75] Inventors: Dimitry G. Grabbe, Middletown; Richard F. Granitz, Harrisburg, both of Pa.

[73] Assignee: AMP Incorporated, Harrisburg, Pa.

[21] Appl. No.: 281,566

[22] Filed: Dec. 8, 1988

[51] Int. Cl.[5] .............................. H01R 9/09
[52] U.S. Cl. .................................. 439/71; 361/403; 439/82
[58] Field of Search ................................ 439/68–73, 439/78–85, 55, 525; 361/403–409, 400; 200/292; 29/837, 839, 842, 843, 845

[56] References Cited

U.S. PATENT DOCUMENTS

| | | | |
|---|---|---|---|
| 4,138,604 | 2/1979 | Harmsen et al. | 200/267 |
| 4,242,719 | 12/1980 | Conley | 361/408 |
| 4,252,390 | 2/1981 | Bowling | 439/73 |
| 4,262,986 | 4/1981 | Cherian et al. | |
| 4,354,729 | 10/1982 | Grabbe et al. | 439/862 |
| 4,359,252 | 11/1982 | Olsson et al. | |
| 4,362,353 | 12/1982 | Cobaugh et al. | |
| 4,511,197 | 4/1985 | Grabbe et al. | |
| 4,513,353 | 4/1985 | Bakermans et al. | 361/399 |
| 4,688,870 | 8/1987 | Egawa et al. | 439/70 |
| 4,695,106 | 9/1987 | Feldman et al. | 439/83 |
| 4,699,593 | 10/1987 | Grabbe et al. | 439/71 |

OTHER PUBLICATIONS

IBM Bulletin, Cunavelis, vol. 14, No. 1, p. 182, 6-1971.

Primary Examiner—Neil Abrams
Attorney, Agent, or Firm—James M. Trygg

[57] ABSTRACT

An electronic component (16, 18) having contact pads (20) is surface mounted to a circuit board (27) by means of electrical terminals (1) each comprising a head (2) having a flat, contact pad engaging, face (6) and a shank (4), which may be in form of a compliant pin, extending normally of the pad engaging face (6). Each pad engaging surface (6) has a gold covering provided by electroplating or by inlaying. The circuit board (27) has metal lined through holes (30) in the same pattern as the pads (20) of the electronic component (16, 18). The shank (4) of each terminal (1) is inserted into the metal lining (36) of a respective hole (30) in the circuit board (27) so that the head (2) of the terminal (1) lies against a land (38) of one of the linings (36), after which the electronic component (16, 18) is seated on the circuit board (27) with each contact pad (20) of the electronic component (16, 18) in engagement with the gold covered face (6) a respective terminal (1). Another embodiment of the invention includes an array (50) of contacts interposed between the components (16, 17) and the circuit board (27) so that the contacts (52) are electrically in between the pads (20) and the respective gold covered faces (6).

8 Claims, 5 Drawing Sheets

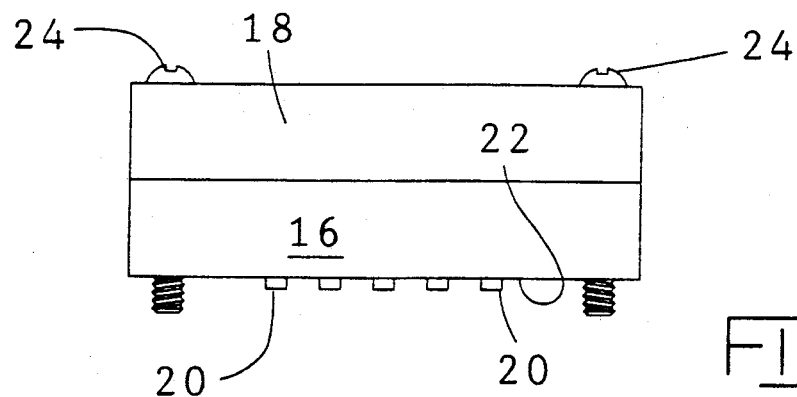
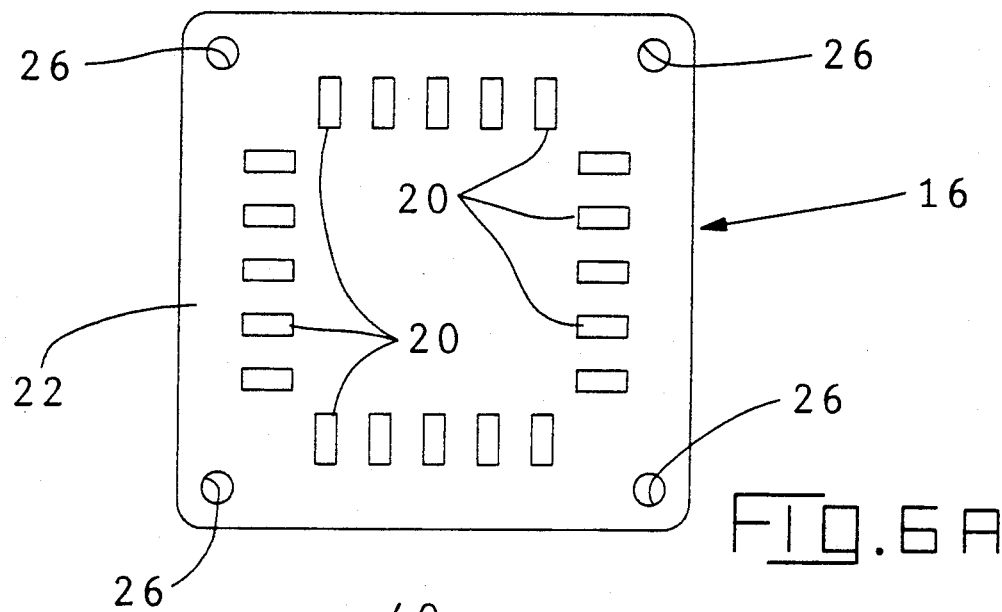
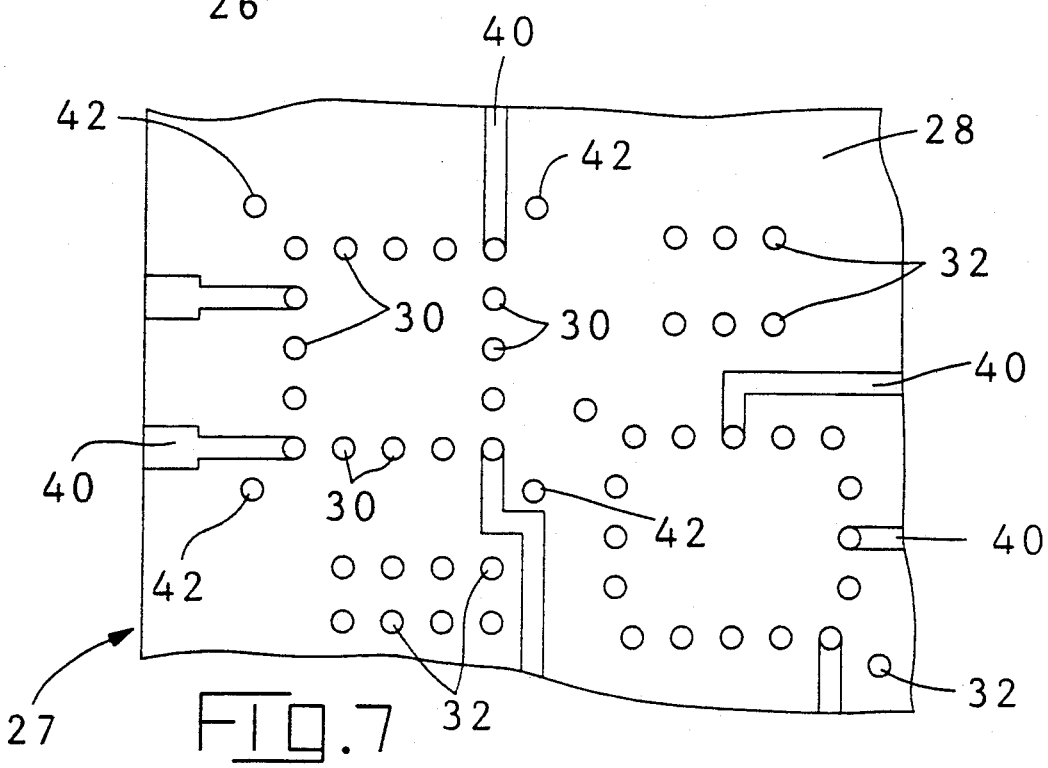

SURFACE MOUNTING AN ELECTRONIC COMPONENT

FIELD OF THE INVENTION

This invention relates to the mounting of an electronic component, for example a microprocessor or an application specific integrated circuit (ASIC), having external contact pads, to a circuit board, the invention concerning, in particular a circuit board for the circuit mounting of such an electronic component thereon, an electrical terminal for use in so mounting the electronic component, and a method of mounting the electronic component to the circuit board.

BACKGROUND OF THE INVENTION

Because of the large number of leads of such components as micro processors and application specific integrated circuits, each of which leads is connected to an external contact pad on a surface of the component, the problem arises of providing reliable mating interfaces between the pads and the circuit board, within the bounds of commercial viability. Although according to the teaching of U.S. Pat. No. 4,511,197, U.S. Pat. No. 4,513,353 and U.S. Pat. No. 4,699,593, there can be interposed between an electronic component and a circuit board, an electrical connector assembly comprising a plurality of spring contact elements each for engagement with a pad on the electronic component and a pad on the circuit board, a gold finish is needed on the pads of the circuit board, especially where high speed electronic components are concerned. The provision of such a gold finish by means of electroplating is undesirably expensive and a pin hole free, pore free, gold surface is not necessarily always achievable.

SUMMARY OF THE INVENTION

The invention proceeds from the appreciation, that a pin hole free, pore free, gold surface can more economically, and reliably be provided, either by electroplating or by gold inlaying, a stamped electrical terminals, than by gold plating the pads of a circuit board.

According to the one aspect of the invention, a circuit board for the surface mounting thereon of an electronic component having external contact pads arranged in a predetermined pattern on an interface surface thereof, comprises; a component mounting major surface and an opposite major surface; a multiplicity of metal lined through holes each opening into both of said major surfaces; electrically conductive strips electrically connected to the metal linings of predetermined ones of said through holes; and a plurality of stamped metal electrical terminals arranged according to said predetermined pattern and each having a shank extending into the metal lining of a respective one of said holes and being electrically connected to said metal lining, and a head projecting from said component mounting surface, and presenting a gold covered, contact pad engaging, outer face directed away from said mounting surface, for engagement by a respective contact pad of said electronic component.

The terminals can readily be stamped from sheet metal stock, for example brass stock, and can be gold plated, at least on their contact pad engaging faces by the use of a conventional gold plating bath, which my have a facility for selectively plating the pad engaging faces. Alternatively, the contact pad engaging surfaces may be inlaid with gold. In either case a pin hole free, pore free, gold surface can be achieved to enable reliable electrical connection between the pads and the terminals and thus between the pads and the electrically conductive strips of the circuit board. The terminals can be inserted in selected holes in the circuit board by means of a commercially available insertion machine.

The shanks of the terminals may be force fitted into the metal linings of the holes, the shanks being, for example, in the form of complaint pins according to the teaching of U.S. Pat. No. 4,186,982 which is incorporated herein by reference, and/or the shanks may be soldered to the metal linings after the shanks have been inserted thereinto.

If, as will usually be the case, the metal linings are extended to form lands surrounding the holes, and lying on the component mounting surface, inner faces of the terminal heads will engage the lands, when the shanks have been inserted into the linings of the holes.

According to a further aspect of the invention, a stamped electrical terminal comprises a head, and a shank extending normally thereof, the head having gold covered, contact pad engaging, flat outer face, facing away from the shank and in relation to which the shank extends normally, and a flat inner face opposite to the said outer face, the shank being dimensioned for insertion into a metal lined hole in a circuit board.

Such stamped terminals, allow considerable flexibility of design.

The head may be of elongate rectangular shape, the shank extending from the head, centrally thereof, or the shank may extend from an edge of the head at one end thereof.

The head may be L-shaped and of rectangular cross section, the shank extending from one arm of the L-shaped head, centrally of the length of that arm.

The head may be circular, the shank extending centrally from the circular head.

The terminal may be of folded construction, the flat outer face of the head being presented by a first flat rectangular plate, having first and second ends each joined by a bight of the terminal material, to a second flat rectangular plate extending parallel to the first rectangular plate, the first and second plates cooperating to provide said flat inner face and having proximate edges from each of which extends a half portion of the shank.

The choice of shape of the head, will depend upon the shape of the pads of the electronic component, and/or upon the location of pads if any, of the component that are to be connected to the gold covered face of the head.

According to a further aspect of the invention, there is provided a method of surface mounting an electronic component having external contact pads arranged in a pattern on an interface surface thereof, to a circuit board having therein a multiplicity of metal lined through holes each opening into a component mounting major surface of the circuit board and into an opposite major surface thereof. The method comprises the steps of: (1) providing a plurality of stamped electrical terminals each comprising a head and a shank extending normally thereof, the head having a gold covered, contact pad engaging, flat outer face in relation to which the shank extends normally; (2) fitting with the aid of a suitably programmed insertion machine, the shank of each terminal into the lining of a predetermined one of said through holes in the circuit board, to secure the terminals to the board in said predetermined pattern with the head of each terminal projecting from said component mounting surface of the circuit board and with the said outer face of the head of the terminal directed away from said component mounting surface; and (3) securing the electronic component in surface to surface engagement with the contact pad engaging face of a respective one of the terminals.

BRIEF DESCRIPTION OF THE DRAWINGS

FIG. 6 is a side view of an electronic component in the form of a chip carrier brackets;

FIG. 6A is an underplan view of the electronic component;

FIG. 7 is a fragmentary plan view of a circuit board on which said component is to be mounted;

DETAILED DESCRIPTION OF THE INVENTION

Each of stamped metal electrical terminals 1A through 1E, respectively, shown in FIGS. 1 through 5 comprises a head, these being referenced 2A through 2E, respectively, and a shank, these being referenced 4A through 4E, respectively. Each terminal head 2A through 2E, has a contact pad engaging flat outer face, these being referenced 6A through 6E respectively, each pad engaging face having gold covering (indicated by dots) produced by electroplating or by means of a gold inlay material, to provide a pin hole free, pore free, gold surface on said outer face. Each shank 4A through 4E extends normally of the respective face 6A through 6E, each head 2A through 2E having a flat inner face, these being referenced 8A through 8E, respectively.

Figure 1:
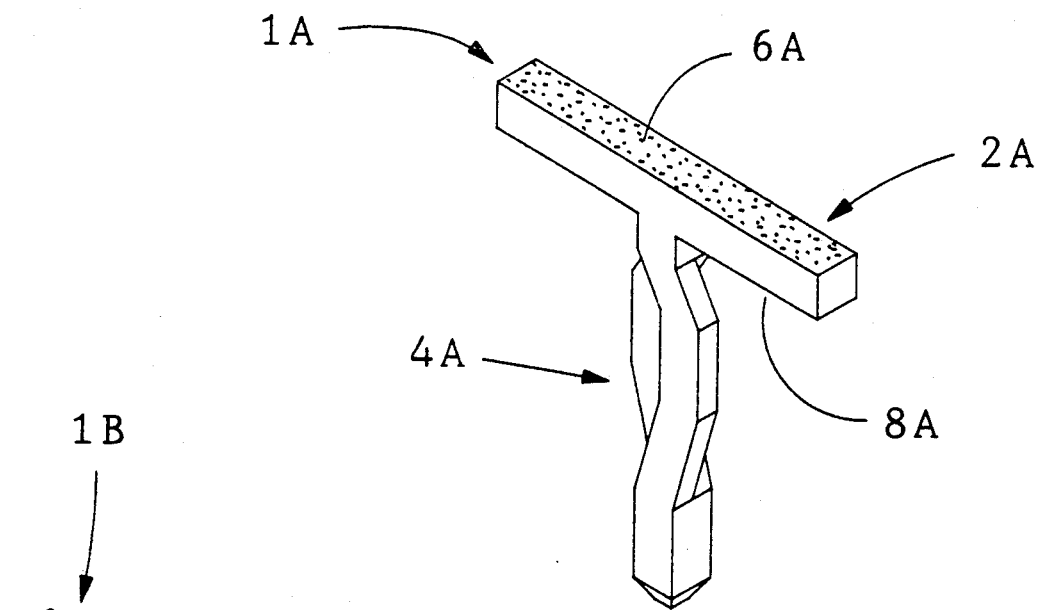
FIGS. 1 to 5 are enlarged isometric views of respective different embodiments of stamped electrical terminals for use in surface mounting an electronic component to a circuit board.
Figure 2:
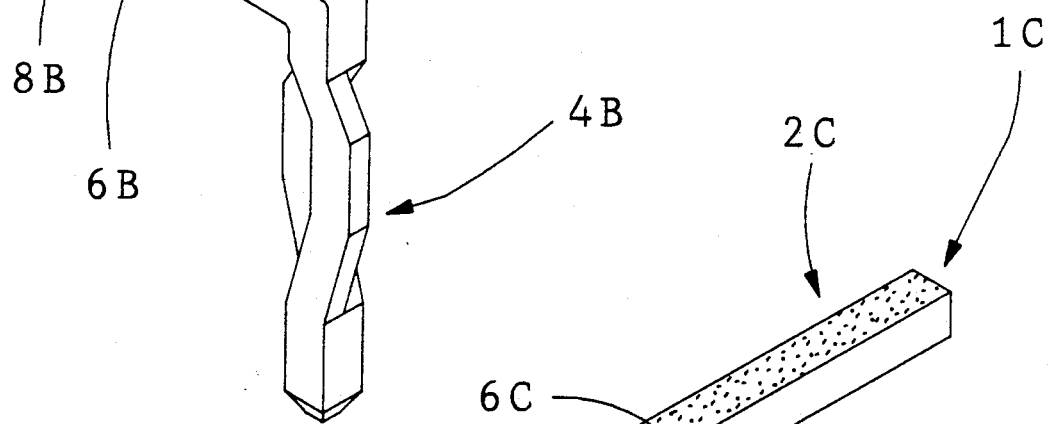
Figure 3:
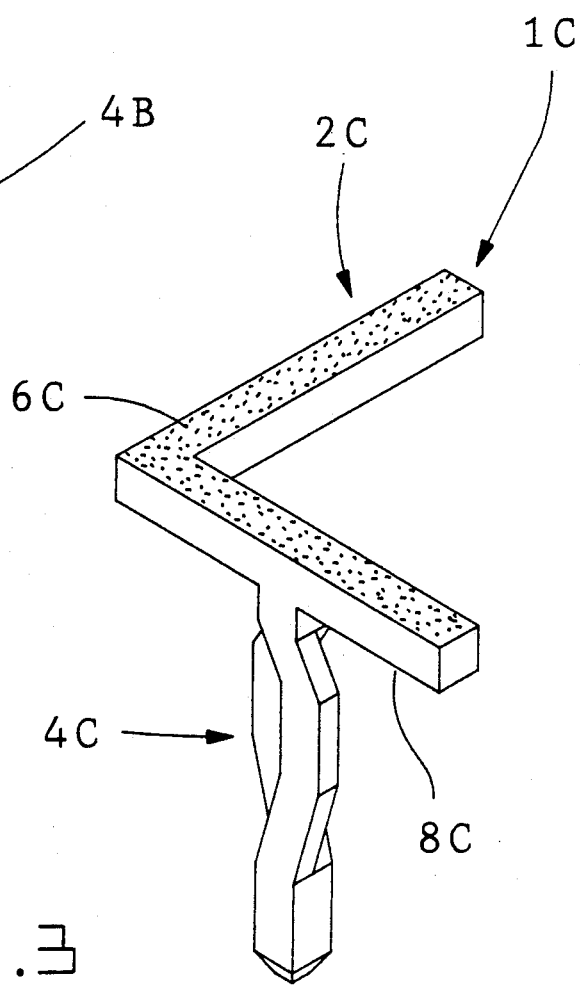
Figure 4:
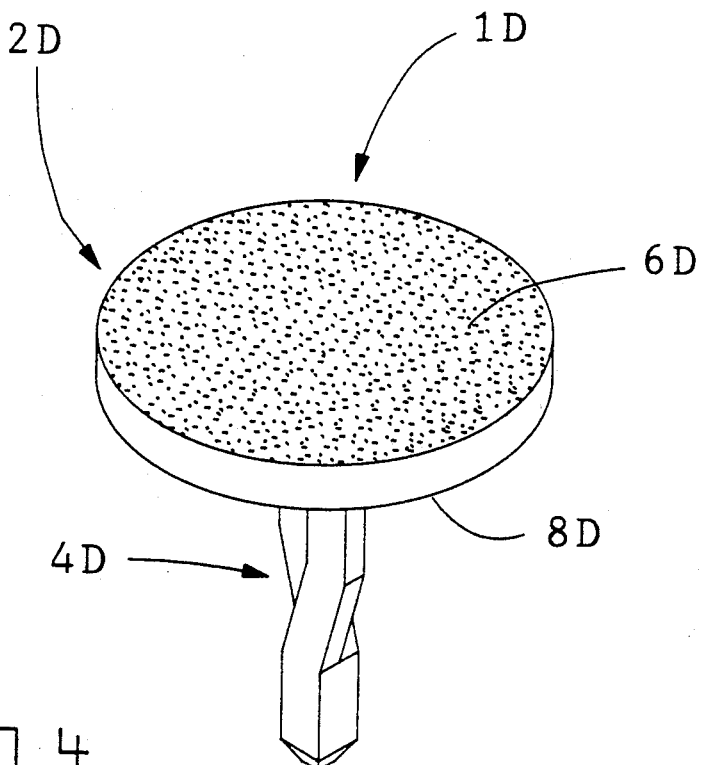

As shown in FIG. 1, the head 2A is elongate and rectangular, the shank 4A projecting from the longitudinal center of the face 8A. As shown in FIG. 2, the head 2B is also elongate and rectangular but the shank 4B projects from an edge of one end of the head 2B. As shown in FIG. 3, the head 2C is L-shaped with the shank 4C projecting from the longitudinal center of one arm of the head 2C. The head 2D of FIG. 4 is circular, the shank 4D projecting centrally from the face 8D. The head 2E comprises a first rectangular plate 9E presenting the contact pad receiving face 6E and being joined at each of two ends by a bend 10E of the terminal material, to a pair of second rectangular plates 12E extending parallel to the plate 9E, the plates 12E cooperating to present the inner surface 8E, a half portion 14E of the shank 4E extending from each of the two proximate edges of the plates 12E.

Figure 8:
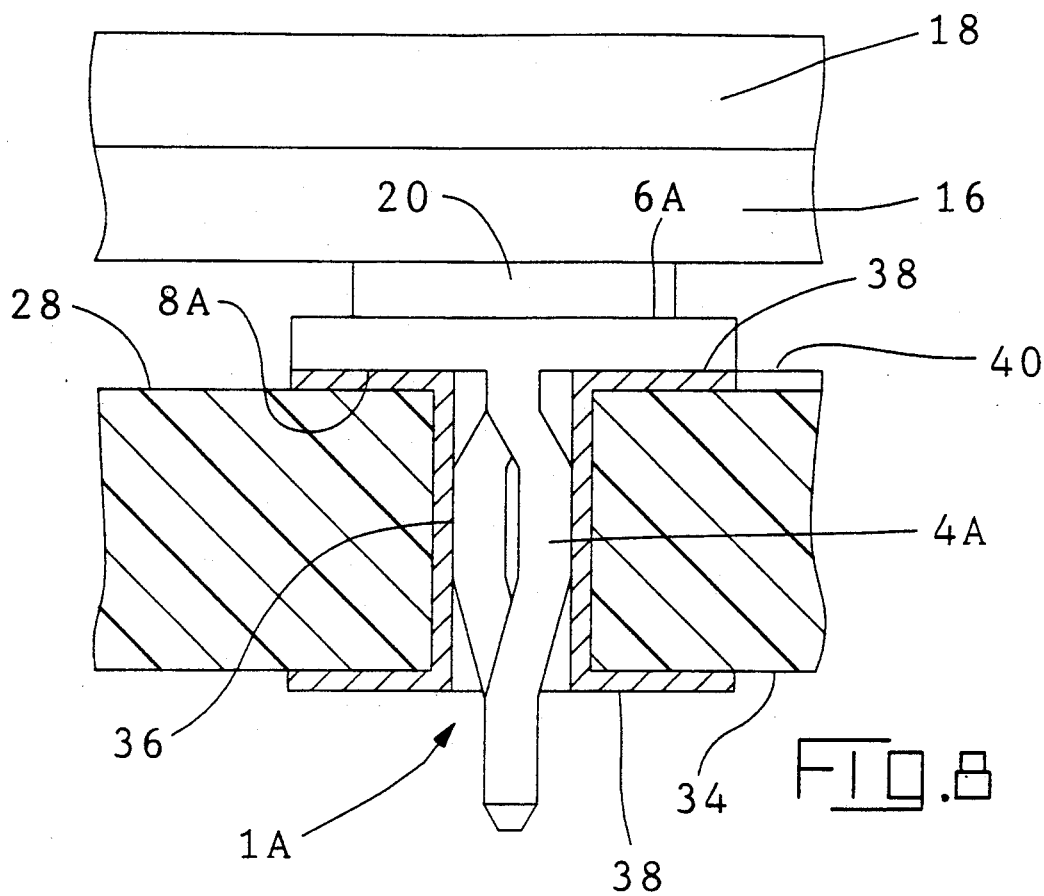
FIG. 8 is a fragmentary side elevational view shown partly in section, illustrating said component mounted to the circuit board and a contact pad of said component electrically connected to a printed conductor thereon, by means of an electrical terminal according to FIG. 1.
Figure 9:
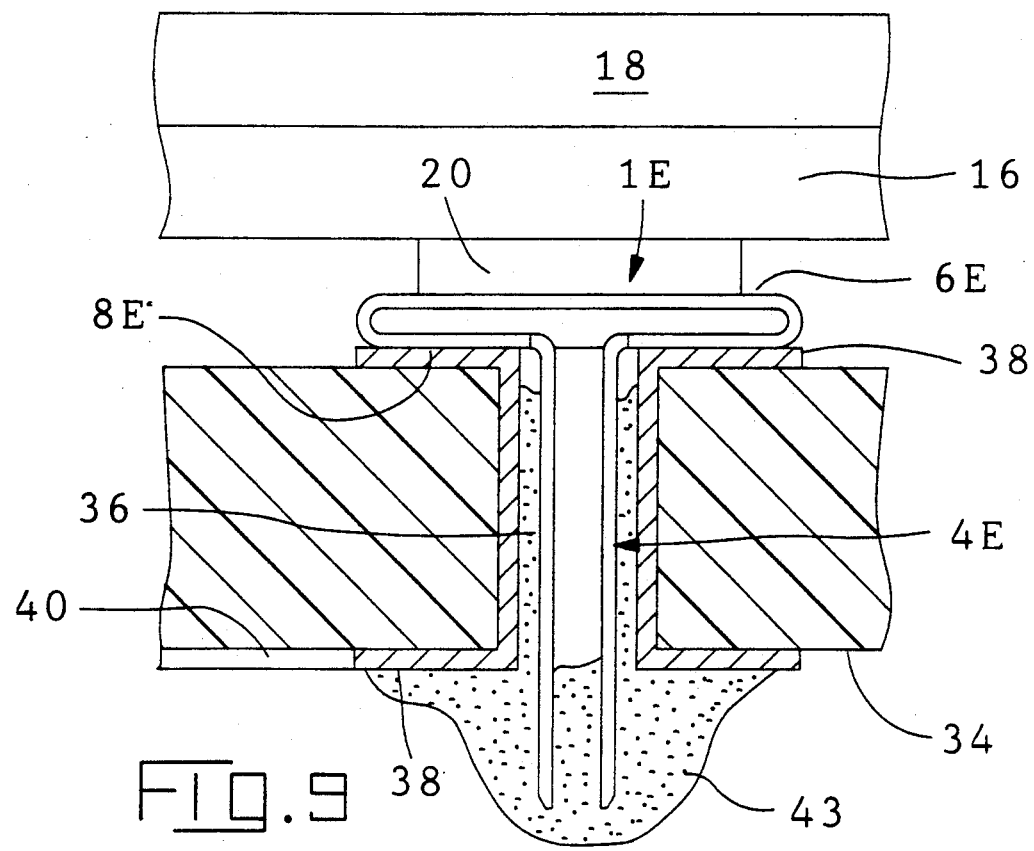
FIG. 9 is a similar view to FIG. 8 but in which the terminal is according to FIG. 5.

As shown in FIGS. 6 and 6A, an electronic surface mount component in the form of a chip carrier 16 carried by a frame 18 has a multiplicity of contact pads 20 projecting from an interface bottom surface 22 of the chip carrier 16 and being arranged in a rectangular array, the pads 20 being connected by means of leads, not shown, to electronic circuitry in the chip carrier 16. There extend through the frame 18 and the chip carrier 16, fasteners 24 inserted through holes 26 for securing the component 16, 18 to a circuit board 27, a fragment of a mounting major surface 28 of which is shown in FIG. 7. There are provided in the circuit board 26, a multiplicity of through holes 30 and 32 (only some of which are shown) each hole opening into the mounting surface 28 and into an opposite major surface 34 of the circuit board 26. Each hole has a metal lining 36, as shown in FIGS. 8 and 9, having extensions providing lands 38 lying against the surfaces 28 and 34 of the circuit board 26. As will be apparent from FIG. 7, the holes 30 are arranged in the same rectangular array as the pads 20 of the chip carrier 16, that is to say, in normally extending rows. The lands 38 are selectively connected to printed conductors, in the form of electrically conductive strips 40 (only some of which are shown) on the surfaces 28 and 40 of the circuit board 26.

Figure 5:
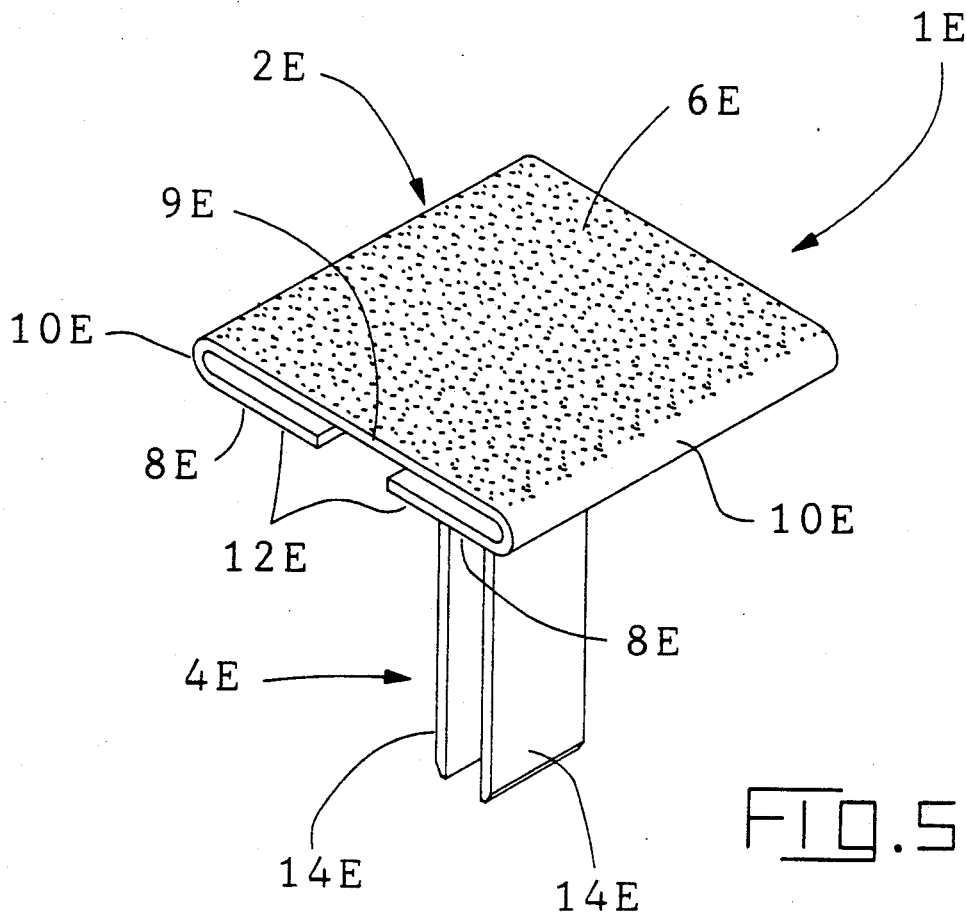

In order to surface mount the components 16 and 18 on the surface 28, and to selectively connect the strips 40 to the pads 20 of the chip carrier 16 and thus to the electronic circuitry thereof, the shanks of electrical terminals according to one or more of FIGS. 1 through 5 are, by means of a suitably programmed conventional insertion machine, inserted into the linings 36 of the holes 30. The terminals to be used are selected in accordance with the configuration of the pads 20 and/or according to whether two or more of the pads are to be connected in common to a particular strip 40. Thus, for example, if a plurality of pads of one row are to be interconnected, the terminal 1B would be used, and if a plurality of pads 20 in two rows extending at right angles to one another are to interconnected, the terminal 1C is used, the terminal 1E being used if a certain resilience in the mounting of the chip carrier is to be desired. The shanks 4A through 4E are formed as compliant pins which can be forced fitted into the linings 36 to make firm and permanent electrical and mechanical contact therewith. These shanks may be, for example, constructed according to the teaching of U.S. Pat. No. 4,186,982 which, as mentioned above, is incorporated herein by reference. Where, however, terminals 1E are used, the shanks 4E may be soldered to the lands 38, by shaping the shanks 4E to merely fit resiliently into the linings 36, only temporarily to secure the terminals 1E to the board 27, as shown in FIGS. 5 and 9. FIG. 8 shows, by way of example, a terminal 1A with its shank 4A force fitted into a lining 36 and FIG. 9 shows a terminal 1E with its shank 4E inserted into a lining 36 and secured therein by means of solder 43.

When the terminals required, have been inserted into the holes 30, the chip carrier with its bracket 18 is mounted on the surface 28 of the circuit board 26 by means of the fasteners 24 inserted through holes 42 therein, so that each pad 20 engages against the gold covered face 6A, 6B, 6C, 6D, or 6E, as the case may be of an individual terminal. Since, as mentioned above, the gold coverings are pin hole free and pore free, most effective and reliable electrical connections are provided between the strips 40 and the pads 20.

Figure 10:
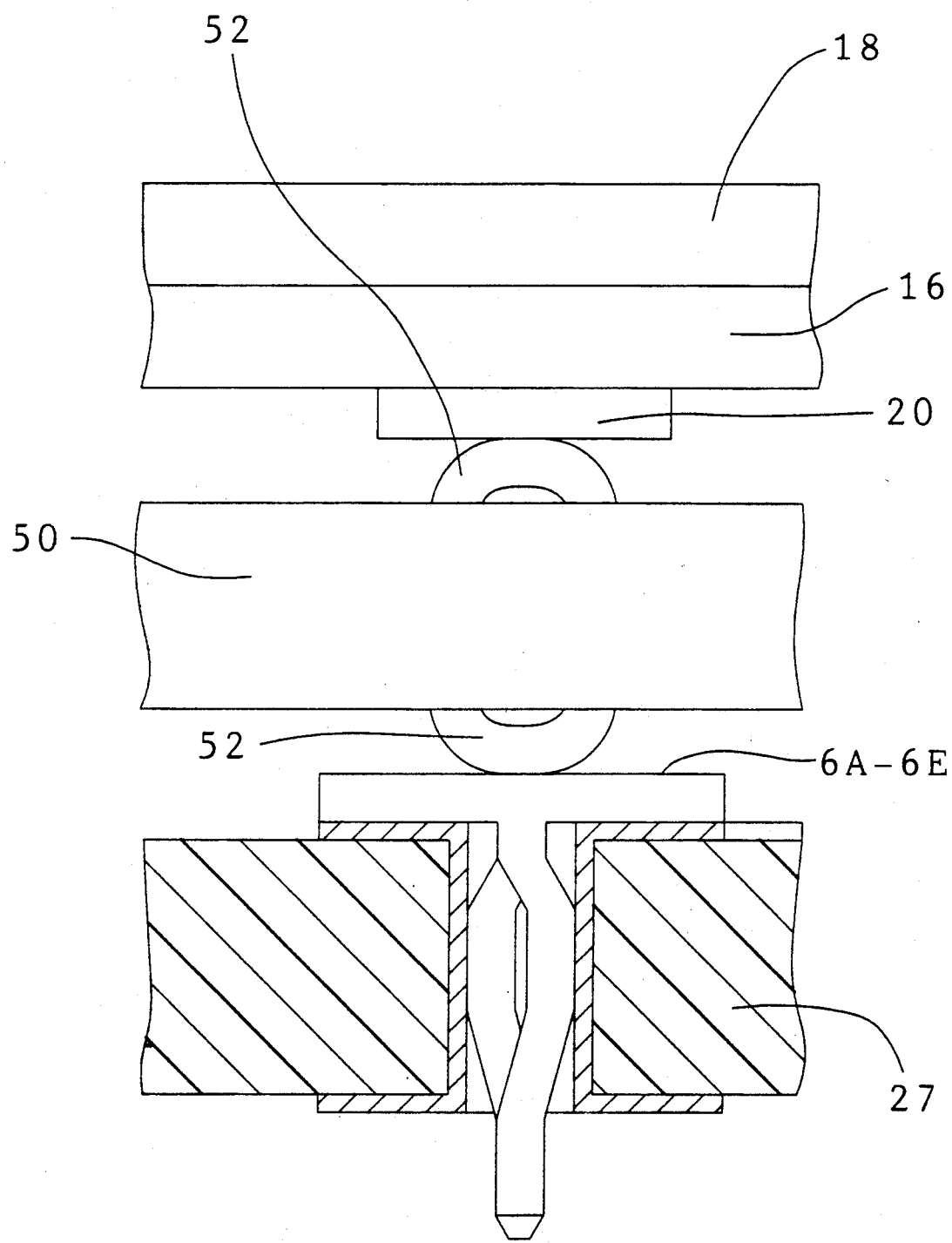
FIG. 10 is a similar view to FIG. 8 but including an interposed contact array.

As will be appreciated by those skilled in the art, printed circuit boards are frequently not flat, thus, when clamping the frame 18 and the chip carrier 16 to such a board, some of the contact pads 20 may not make good electrical contact with their respective terminals 1A through 1E. In these situations it is necessary to utilize an interposed contact array having sufficiently resilient spring contacts to absorb any warp that is present in the printed circuit board. Such an arrangement is shown in FIG. 10 wherein the terminals 1A through 1E and contact pads 20 of FIG. 8 are shown having the contact array 50 interposed therebetween. The contact array 50 has spring contacts 52 which are spaced to correspond to the spacing of the pads 20 and terminals 1A through 1E. For a more detailed explanation of the contact array 50, see U.S. Pat. No. 4,699,593 which issued Oct. 13, 1987 to Grabbe et al., and which is incorporated herein by reference. When the frame 18, carrier 16, and contact array 50 are assembled to the board 27 with the screw fasteners 24, the contacts 52 will compress, thereby providing good electrical contact to all pads and terminals.

A very important advantage of the present invention is the capability of providing pin hole free, pore fee gold contact surfaces on a printed circuit board which are both economic to manufacture and reliable in use.

What is claimed is:

1. A circuit board for the surface mounting thereon of an electronic component having external contact pads arranged in a predetermined pattern on an interface surface thereof, the circuit board comprising;

a major mounting surface and an opposite major surface;

a multiplicity of metal lined through holes each opening into both of said major surfaces and having an extension in the form of a land surrounding the hole and lying on said major mounting surface;

electrically conductive strips electrically connected to the metal linings of predetermined ones of the said through holes; and a plurality of stamped metal electrical terminals arranged according to said predetermined pattern and each having a shank extending into the metal lining of a respective one of said holes and being electrically connected to said metal lining, and a head attached to said shank having an inner face thereof in surface to surface contact with said land, said head presenting a gold covered, contact pad engaging, flat outer face disposed normal to said shank and directed away from said mounting surface, for engagement by a respective contact pad of said electronic component.

2. A circuit board as claimed in claim 1, wherein at least said contact pad engaging face of each terminal is electroplated with gold.

3. A circuit board as claimed in claim 1, wherein said contact pad face of each terminal is inlaid with gold.

4. A circuit board as claimed in claim 1, wherein the shank of each terminal is formed as a compliant pin and is force fitted into said metal lining.

5. A circuit board as claimed in claim 1, wherein the shank of each terminal is soldered to said metal lining.

6. A circuit board as claimed in claim 1 including a contact array having a plurality of resilient spring contacts interposed between said circuit board and said electronic component so that each of said external contact pads and its corresponding electrical terminal are in electrical contact with a respective one of said plurality of resilient spring contacts.

7. A stamped and formed electrical terminal comprising a head of rectangular cross section, and a shank extending normally thereof, the head being L-shaped and having a gold covered, contact pad engaging, flat outer face facing away from the shank and in relation to which the shank extends normally from the longitudinal center of an arm of the L-shaped head, and a flat inner face opposite to said outer face, the shank being dimensioned for insertion into a metal lined hole in a circuit board.

8. A stamped and formed electrical terminal comprising a head, and a shank extending normally thereof, the head having a gold covered, contact pad engaging, flat outer face facing away from the shank and in relation to which the shank extends normally and a flat inner face opposite to said outer face, the shank being dimensioned for insertion into a metal lined hole in a circuit board wherein the flat outer face of the head is presented by a first flat rectangular plate, having first and second ends each joined by a bend of the terminal material, to a pair of second flat rectangular plates extending parallel to the first rectangular plate, the second plates cooperating to present said flat inner face and having proximate edges from each of which extends a half portion of said shank.

* * * * *